(12) United States Patent
Sugiura et al.

(10) Patent No.: US 9,772,365 B2
(45) Date of Patent: Sep. 26, 2017

(54) DETECTION CIRCUIT

(71) Applicant: Seiko Instruments Inc., Chiba-shi, Chiba (JP)

(72) Inventors: Masakazu Sugiura, Chiba (JP); Atsushi Igarashi, Chiba (JP)

(73) Assignee: SII Semiconductor Corporation (JP)

( * ) Notice: Subject to any disclaimer, the term of this patent is extended or adjusted under 35 U.S.C. 154(b) by 17 days.

(21) Appl. No.: 15/002,686

(22) Filed: Jan. 21, 2016

(65) Prior Publication Data
US 2016/0216307 A1 Jul. 28, 2016

(30) Foreign Application Priority Data

Jan. 23, 2015 (JP) ................... 2015-011545
Apr. 7, 2015 (JP) ................... 2015-078580

(51) Int. Cl.
*G01R 31/02* (2006.01)
*H03K 17/18* (2006.01)

(52) U.S. Cl.
CPC ........... *G01R 31/026* (2013.01); *H03K 17/18* (2013.01); *H03K 2217/0054* (2013.01)

(58) Field of Classification Search
CPC combination set(s) only.
See application file for complete search history.

(56) References Cited

U.S. PATENT DOCUMENTS 4,831,483 A * 5/1989 Matsumura .............. H02H 3/04
323/278

FOREIGN PATENT DOCUMENTS

JP 06-289087 A 10/1994

* cited by examiner

*Primary Examiner* — Clayton E Laballe
*Assistant Examiner* — Jas Sanghera
(74) *Attorney, Agent, or Firm* — Brinks Gilson & Lione

(57) ABSTRACT

Provided is a detection circuit configured to avoid erroneous detection that may occur immediately after a detection circuit is powered on. The detection circuit includes: an output transistor connected between a voltage input terminal and a voltage output terminal; and a load open-circuit detection circuit configured to detect an open circuit of a load connected to the voltage output terminal, in which an output circuit of the load open-circuit detection circuit includes a first transistor and a second transistor connected in series, the first transistor having a gate connected to the output transistor in common, the second transistor having a gate to which a signal indicating that the open-circuit of the load is detected, and in which the first transistor is in an off state when the output transistor is in an off state.

5 Claims, 6 Drawing Sheets

DETECTION CIRCUIT

RELATED APPLICATIONS

This application claims priority under 35 U.S.C. §119 to Japanese Patent Applications No. 2015-011545 filed on Jan. 23, 2015 and No. 2015-078580 filed on Apr. 7, 2015, the entire content of which are hereby incorporated by reference.

BACKGROUND OF THE INVENTION

1. Field of the Invention

The present invention relates to a detection circuit configured to detect an open circuit of a load connected thereto.

2. Description of the Related Art

A related-art detection circuit is illustrated in FIG. 6. The related-art detection circuit includes a voltage input terminal 401, a voltage output terminal 402, an output transistor 403, a control circuit 404, a load open-circuit detection circuit 405 configured to detect an open circuit of a load connected to the voltage output terminal 402, and an output terminal 406 of the load open-circuit detection circuit 405.

The control circuit 404 controls the output transistor 403 to be turned on and off. When detecting an open circuit of a load connected to the voltage output terminal 402, the load open-circuit detection circuit 405 outputs a detection signal to the output terminal 406.

In the load open-circuit detection circuit 405, there is often employed a method involving monitoring a current of the output transistor 403, to thereby detect an open circuit of a load connected to the voltage output terminal 402. For example, a resistor 410 is connected between the voltage input terminal 401 and the output transistor 403, and whether a load is open or not is determined based on a voltage generated across both ends of the resistor 410. Under a state in which a load connected to the voltage output terminal 402 is open, no current flows through the output transistor 403, and hence an open circuit of a load connected to the voltage output terminal 402 is detected as described above.

The output transistor 403 is large in element size and input capacitance so that the output transistor 403 may cause large current to flow depending on a load connected to the voltage output terminal 402. It takes physical time to charge and discharge the large input capacitance of the output transistor 403 to control the output transistor 403 to be turned on and off, and hence it is difficult for the output transistor 403 to be turned on as soon as the detection circuit is powered on. Consequently, the output transistor 403 is still in an off state immediately after the detection circuit is powered on, and hence no voltage is generated at the resistor 410 even though a load is not actually open.

The related-art detection circuit illustrated in FIG. 6 therefore has a problem in that, immensely after the detection circuit is powered on, the load open-circuit detection circuit 405 erroneously determines that a voltage generated at the resistor 410 is small.

SUMMARY OF THE INVENTION

The present invention is devised in order to solve the problem described above, and provides a detection circuit configured to avoid erroneous detection that may occur immediately after the detection circuit is powered on.

In order to solve the problem of the related art, according to one embodiment of the present invention, there is provided a detection circuit, including: an output transistor connected between a voltage input terminal and a voltage output terminal; and a load open-circuit detection circuit configured to detect an open circuit of a load connected to the voltage output terminal, in which an output circuit of the load open-circuit detection circuit includes a first transistor and a second transistor connected in series, the first transistor having a gate connected to the output transistor in common, the second transistor having a gate to which a signal indicating that the open-circuit of the load is detected, and in which the first transistor is in an off state when the output transistor is in an off state.

According to the one embodiment of the present invention, a semiconductor device may be provided with a detection circuit configured to avoid erroneous detection that may occur immediately after the detection circuit is powered on.

DETAILED DESCRIPTION OF THE PREFERRED EMBODIMENTS

Now, exemplary embodiments of the present invention are described with reference to the drawings.

Figure 1:
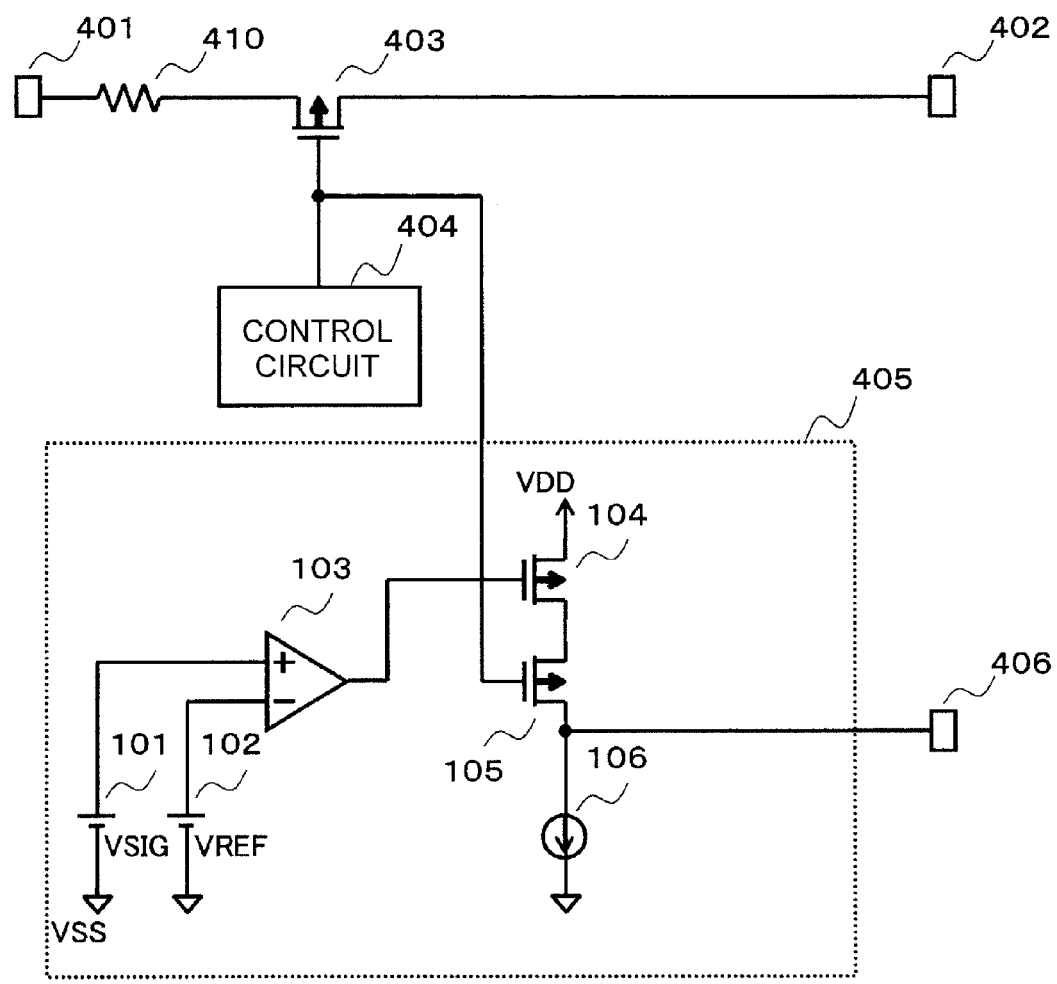
FIG. 1 is an explanatory diagram for illustrating a detection circuit according to an embodiment of the present invention.

FIG. 1 is an explanatory diagram for illustrating a detection circuit according to an embodiment of the present invention.

The detection circuit of this embodiment includes a voltage input terminal 401, a voltage output terminal 402, an output transistor 403 connected between the voltage input terminal 401 and the voltage output terminal 402, a control circuit 404, a load open-circuit detection circuit 405, an output terminal 406 of the load open-circuit detection circuit 405, and a resistor 410. The load open-circuit detection circuit 405 detects an open circuit of a load connected to the voltage output terminal 402. A voltage corresponding to a current of the output transistor 403 is generated at the resistor 410 so that the current is monitored.

The load open-circuit detection circuit 405 includes a voltage circuit 101, a voltage source 102, a comparator 103, a transistor 104, a transistor 105, and a current source 106. The voltage circuit 101 generates a VSS-based voltage VSIG based on a voltage generated across both ends of the resistor 410. The voltage source 102 generates a reference voltage VREF. The comparator 103 compares the voltage VSIG and the reference voltage VREF to each other, to thereby control the transistor 104 to be turned on and off. The transistor 105 has a gate connected to the output transistor 403 in common, and is connected to the transistor 104 in series. The current source 106 is connected to the transistors 104 and 105 in series, the transistors 104 and 105 being connected in series as well. A node of the current source 106 and the transistors 104 and 105 is connected to the output terminal 406. The transistors 104 and 105 and the current source 106 form an output circuit of the load open-circuit detection circuit 405.

Figure 5:
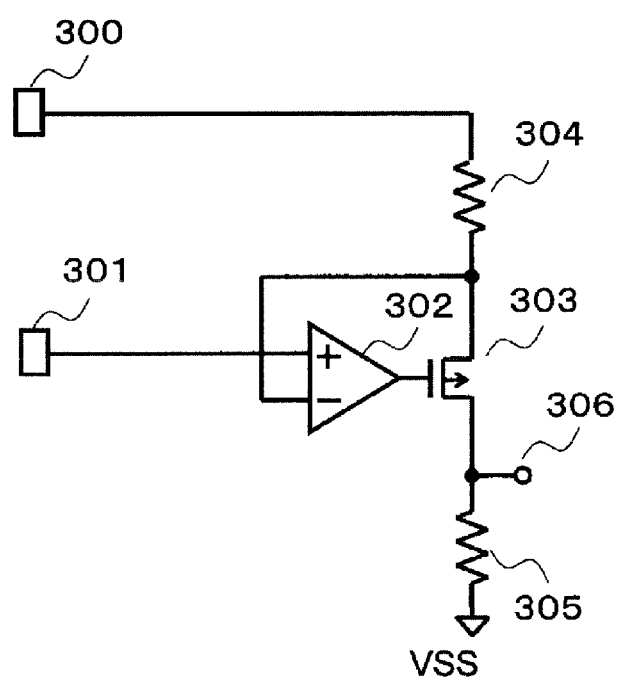
FIG. 5 is an explanatory diagram for illustrating an example of a voltage circuit of the detection circuit of this embodiment.
Figure 6:
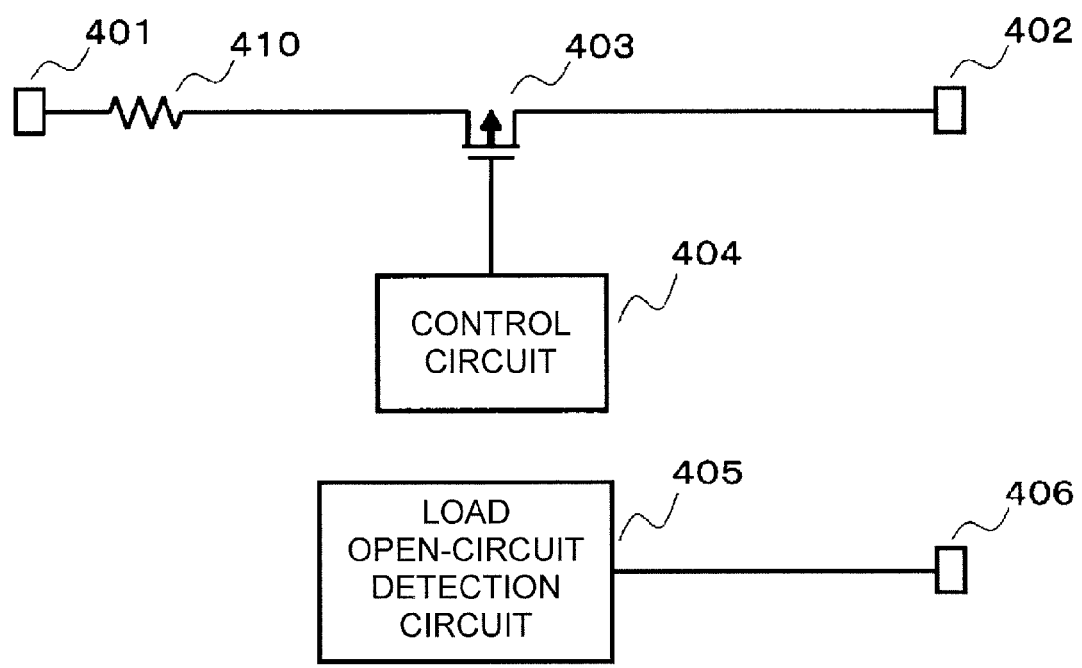
FIG. 6 is an explanatory diagram for illustrating a related-art detection circuit.

FIG. 5 is a circuit diagram for illustrating an example of the voltage circuit 101. The voltage circuit 101 illustrated in FIG. 5 includes input terminals 300 and 301, an amplifier 302, resistors 304 and 305, a transistor 303, and an output terminal 306. The input terminal 300 is connected to a terminal of the resistor 410 on the voltage input terminal 401 side. The input terminal 301 is connected to the other terminal of the resistor 410.

As the VSS-based voltage VSIG, the voltage circuit 101 outputs to a terminal 306 a voltage obtained by multiplying a voltage generated across both the ends of the resistor 410 based on a voltage of the voltage input terminal 401 by a resistance ratio.

Note that, the voltage circuit 101 is not limited to this circuit as long as the voltage circuit 101 generates the VSS-based voltage VSIG based on a voltage generated across both the ends of the resistor 410.

Next, the operation of the detection circuit of this embodiment is described. The control circuit 404 controls the output transistor 403 to be turned on and off. When detecting an open circuit of a load connected to the voltage output terminal 402, the load open-circuit detection circuit 405 outputs a detection signal (High level) to the output terminal 406. A voltage is generated at the resistor 410 based on a current of the output transistor 403, and hence under a state in which a load connected to the voltage output terminal 402 is open, no current flows through the output transistor 403. Thus, an open circuit of a load is detected when a voltage generated at the resistor 410 is determined to be a certain value or less.

The voltage VSIG is generated based on a voltage generated at the resistor 410, and is thus small when the voltage generated at the resistor 410 is small. Consequently, under a state in which a load connected to the voltage output terminal 402 is open, the voltage VSIG is small. When determining that VSIG<VREF is satisfied, the comparator 103 controls the transistor 104 to be turned on.

The output transistor 403 is large in element size and input capacitance so that the output transistor 403 can cause large current to flow. Thus, the output transistor 403 is not turned on as soon as the detection circuit is powered on. In this case, the transistor 105 is set so as to be off when the detection circuit is powered on similarly to the output transistor 403. That is, when the detection circuit is powered on and the output transistor 403 is still in an off state, the transistor 105 is in an off state as well, and hence a detection signal is not output to the output terminal 406 of the load open-circuit detection circuit 405 even when the transistor 104 is turned on with an output of the comparator 103.

As described above, according to one embodiment of the present invention, there is provided a detection circuit configured to avoid erroneous detection that may occur immediately after the detection circuit is powered on.

Note that, it is obvious that the structure and the characteristics of the transistor 105 are not limited as long as the transistor 105 performs, with a control signal of the control circuit 404, the same operation as the output transistor 403 immediately after the detection circuit is powered on. For example, the transistor 105 has the same type and the same threshold as the output transistor 403.

Further, the transistor 105 is herein a single transistor. However, an additional transistor may be diode-connected to a source of the transistor 105, or a Darlington connection may be employed so that the threshold of the transistor 105 is higher than that of the output transistor 403.

Further, the gate of the transistor 105 is not necessarily required to be connected to the output transistor 403 in common, and the gate of the transistor 105 may be connected to the output transistor 403 via a voltage level shift stage. The voltage level shift stage is formed, for example, of a source follower amplifier stage. In this case, a gate-source voltage of the transistor 105 is smaller than that of the output transistor 403, and hence it is obvious that erroneous detection can be more reliably avoided.

In this case, the detection circuit of FIG. 1 cannot output a signal indicating that a load is open when the control circuit 404 controls the output transistor 403 to be off. For example, while the load open-circuit detection circuit 405 is detecting an open circuit of a load, the control circuit 404 may control the output transistor 403 to be off due to an increase in ambient temperature.

Figure 2:
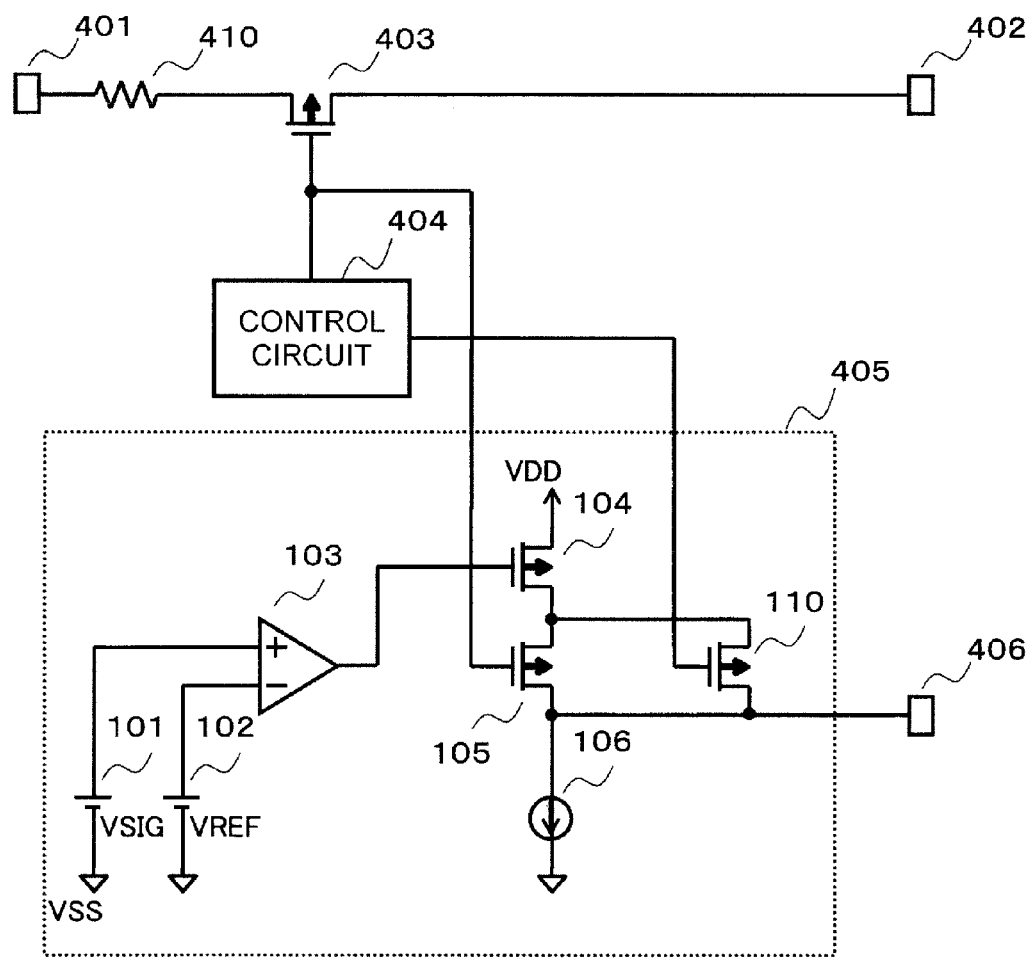
FIG. 2 is an explanatory diagram for illustrating another example of the detection circuit of this embodiment.

FIG. 2 is an explanatory diagram for illustrating another example of the detection circuit according this embodiment. FIG. 2 differs from FIG. 1 in that a transistor 110 that is controlled by the control circuit 404 is additionally connected in parallel to the transistor 105. The control circuit 404 controls the transistor 110 to be turned on based on, for example, the above-mentioned state, thereby being capable of disabling the transistor 105. Thus, a detection signal can be output to the output terminal 406 of the load open-circuit detection circuit 405 even when the output transistor 403 is still in an off state.

Figure 3:
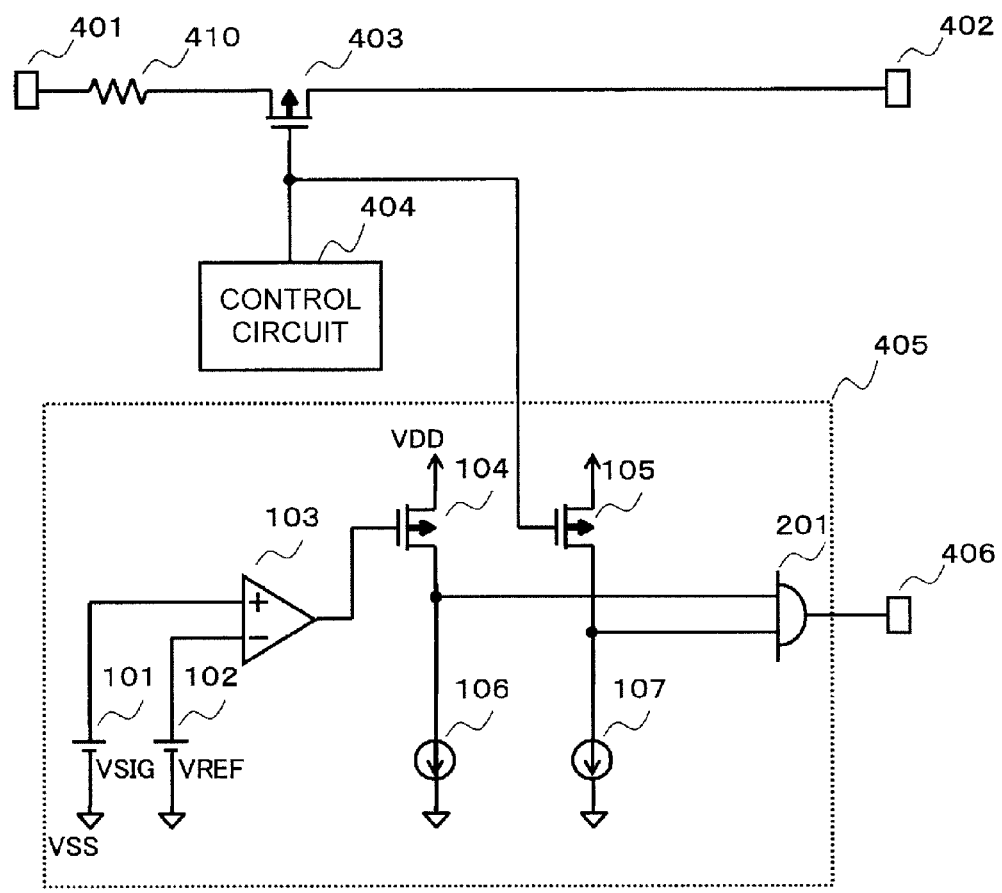
FIG. 3 is an explanatory diagram for illustrating still another example of the detection circuit of this embodiment.

FIG. 3 is an explanatory diagram for illustrating still another example of the detection circuit of this embodiment. The detection circuit of FIG. 3 differs from that of FIG. 1 in that an output circuit of the load open-circuit detection circuit 405 includes the transistor 104 and the current source 106 connected in series, the transistor 105 and the current source 107 connected in series, and an AND circuit 201. Also with this configuration, the same effect as the detection circuit of FIG. 1 can be obtained.

Note that, it is obvious that the same effect can be obtained with the use of an appropriate circuit using, for example, an OR circuit as long as such conditions are satisfied that the circuit includes logic gates whose outputs are forcibly fixed or the combination thereof.

Figure 4:
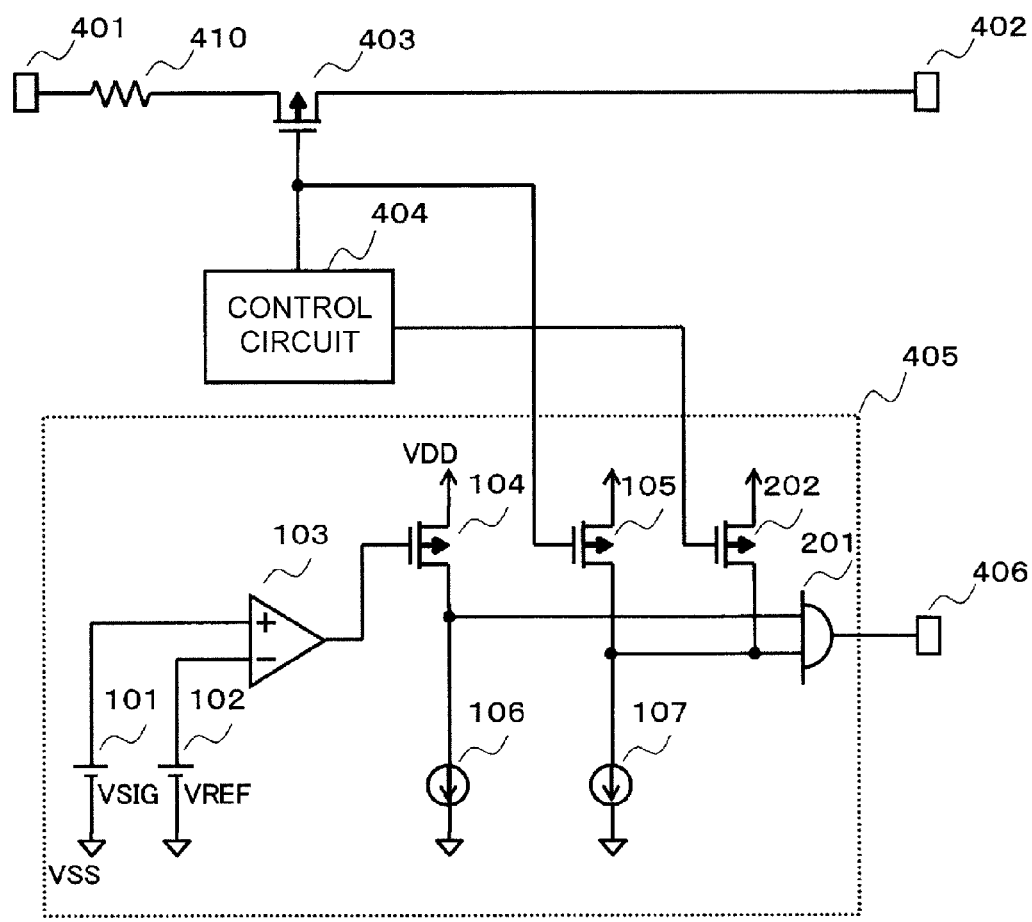
FIG. 4 is an explanatory diagram for illustrating yet another example of the detection circuit of this embodiment.

FIG. 4 is an explanatory diagram for illustrating yet another example of the detection circuit of this embodiment. Similarly to the circuit of FIG. 2, a circuit of FIG. 4 includes a transistor 202 and the transistor 105 connected in parallel to each other. Also with this configuration, the same effect as the circuit of FIG. 2 can be obtained.

Note that, the load open-circuit detection circuit 405 is described with reference to the circuits illustrated in FIG. 1 to FIG. 4. However, those circuits are examples, and modes for carrying out the present invention are not limited as long as the same effect can be obtained.

In the above description, the level of each output is defined as a High level or a Low level for convenience, but there is no particular limitation.

What is claimed is:
1. A detection circuit, comprising:
   a voltage input terminal;
   a voltage output terminal;
   an output transistor connected between the voltage input terminal and the voltage output terminal;
   a control circuit configured to control the output transistor; and
   a load open-circuit detection circuit configured to detect an open circuit of a load connected to the voltage output terminal and comprising a comparator which outputs a signal indicating detection of the open-circuit of the load;

wherein an output circuit of the load open-circuit detection circuit comprises a first transistor and a second transistor connected in series, the first transistor having a gate connected to the output transistor in common, the second transistor having a gate connected to the comparator and controlled to be turned on or off by the comparator, the gate of the second transistor connected to the gate of the first transistor in series; and wherein the first transistor is in an off state when the output transistor is in an off state.

2. A detection circuit according to claim 1, further comprising a third transistor that is connected in parallel to the first transistor, and is controlled by the control circuit.

3. A detection circuit, comprising:
a voltage input terminal;
a voltage output terminal;
an output transistor connected between the voltage input terminal and the voltage output terminal;
a control circuit configured to control the output transistor; and
a load open-circuit detection circuit configured to detect an open circuit of a load connected to the voltage output terminal, wherein an output circuit of the load open-circuit detection circuit comprises a first transistor and a second transistor connected in series, the first transistor having a gate connected to the output transistor in common, the second transistor having a gate to which a signal indicating that the open-circuit of the load is detected, and wherein the first transistor is in an off state when the output transistor is in an off state;

wherein the first transistor comprises one of a transistor having the same type and the same threshold as the output transistor, and a transistor having a threshold higher than a threshold of the output transistor.

4. A detection circuit, comprising:
a voltage input terminal;
a voltage output terminal;
an output transistor connected between the voltage input terminal and the voltage output terminal;
a control circuit configured to control the output transistor; and
a load open-circuit detection circuit configured to detect an open circuit of a load connected to the voltage output terminal, wherein an output circuit of the load open-circuit detection circuit comprises a first transistor and a second transistor connected in series, the first transistor having a gate connected to the output transistor in common, the second transistor having a gate to which a signal indicating that the open-circuit of the load is detected, and wherein the first transistor is in an off state when the output transistor is in an off state;

wherein a gate of the output transistor and the gate of the first transistor are connected to each other via a voltage level shift stage.

5. A detection circuit according to claim 4, wherein the voltage level shift stage is a source follower amplifier stage.

* * * * *